United States Patent [19]

West et al.

[11] Patent Number: 5,061,600
[45] Date of Patent: Oct. 29, 1991

[54] RADIATION-SENSITIVE COMPOSITION CONTAINING BOTH A VINYL PYRROLIDONE POLYMER AND AN UNSATURATED POLYESTER AND USE THEREOF IN LITHOGRAPHIC PRINTING PLATES

[75] Inventors: Paul R. West, Fort Collins; James E. Mitchell, Windsor; Gary R. Miller, Fort Collins; Paul R. Josephson, Jr., Fort Collins; Raymond W. Ryan, Jr., Fort Collins, all of Colo.

[73] Assignee: Eastman Kodak Company, Rochester, N.Y.

[21] Appl. No.: 554,230

[22] Filed: Jul. 17, 1990

[51] Int. Cl.$^5$ ................................................ E03C 1/77
[52] U.S. Cl. .................................... 430/273; 430/285; 430/302
[58] Field of Search ................. 430/278, 285, 302, 281

[56] References Cited

U.S. PATENT DOCUMENTS

| | | |
|---|---|---|
| 3,677,755 | 7/1972 | Fukui et al. ........................ 430/281 |
| 3,808,004 | 4/1974 | Thomas et al. . |
| 3,929,489 | 12/1975 | Arcesi et al. . |
| 4,139,390 | 2/1979 | Rauner et al. . |
| 4,264,713 | 4/1981 | Shinozzki et al. .................. 430/302 |
| 4,272,611 | 6/1981 | Vyvial et al. ...................... 430/306 |
| 4,419,437 | 12/1983 | Noonan et al. . |
| 4,425,424 | 1/1984 | Altland et al. . |
| 4,640,886 | 3/1987 | Miller et al. . |
| 4,956,264 | 9/1990 | Geissler et al. .................... 430/281 |

FOREIGN PATENT DOCUMENTS 722264 1/1955 United Kingdom .

*Primary Examiner*—Marion E. McCamish
*Assistant Examiner*—C. D. RoDee
*Attorney, Agent, or Firm*—Alfred P. Lorenzo

[57] ABSTRACT

Radiation-sensitive compositions which are especially useful in the production of negative-working lithographic printing plates comprise a photocrosslinkable polymer containing the photosensitive group

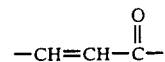

as an integral part of the polymer backbone and, in an amount sufficient to improve the properties of the composition, both a polymer of vinyl pyrrolidone and an unsaturated polyester such as a polyester derived from fumaric acid and a 4,4'-isopropylidine-diphenol. The combination of a polymer of vinyl pyrrolidone and an unsaturated polyester improves the properties of the radiation-sensitive composition in regard to such factors as shelf life, image contrast, developability and ink receptivity and thereby provides a superior lithographic printing plate.

14 Claims, No Drawings

RADIATION-SENSITIVE COMPOSITION CONTAINING BOTH A VINYL PYRROLIDONE POLYMER AND AN UNSATURATED POLYESTER AND USE THEREOF IN LITHOGRAPHIC PRINTING PLATES

FIELD OF THE INVENTION

This invention relates in general to radiation-sensitive compositions and in particular to radiation-sensitive compositions which contain a photocrosslinkable polymer. More specifically, this invention relates to novel radiation-sensitive compositions which are especially useful in the production of lithographic printing plates.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

Negative-working lithographic printing plates are prepared from negative-working radiation-sensitive compositions that are formed from polymers which crosslink in radiation-exposed areas. A developing solution is used to remove the unexposed portions of the coating to thereby form a negative image.

The most widely used type of negative-working lithographic printing plate comprises a layer of a radiation-sensitive composition applied to an aluminum substrate and commonly includes a subbing layer or interlayer to control the bonding of the radiation-sensitive layer to the substrate. The aluminum substrate is typically provided with an anodized coating formed by anodically oxidizing the aluminum in an aqueous electrolyte solution.

It is well known to prepare negative-working lithographic printing plates utilizing a radiation-sensitive composition which includes a photocrosslinkable polymer containing the photosensitive group:

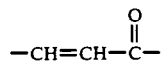

as an integral part of the polymer backbone. (See, for example, U.S. Pat. Nos. 3,030,208, 3,622,320, 3,702,765 and 3,929,489). A typical example of such a photocrosslinkable polymer is the polyester prepared from diethyl p-phenylenediacrylate and 1,4-bis(β-hydroxyethoxy)-cyclohexane, which is comprised of recurring units of the formula:

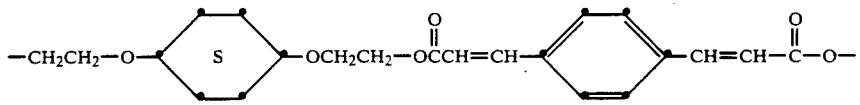

This polyester, referred to hereinafter as Polymer A, has been employed for many years in lithographic printing plates which have been extensively used on a commercial basis. These printing plates have typically employed an anodized aluminum substrate which has been formed by electrolytic anodization with an electrolyte comprised of phosphoric acid.

Polyesters in addition to Polymer A which are especially useful in the preparation of lithographic printing plates are those which incorporate ionic moieties derived from monomers such as dimethyl-3,3'-[(sodioimino)disulfonyl]dibenzoate and dimethyl-5-sodiosulfoisophthalate. Polyesters of this type are well known and are described, for example, in U.S. Pat. No. 3,929,489 issued Dec. 30, 1975. A preferred polyester of this type, referred to hereinafter as Polymer B, is poly[1,4-cyclohexylene-bis(oxyethylene)-p-phenylenediacrylate]-co-3,3'-[(sodioimino)disulfonyl]dibenzoate. Another preferred polyester of this type, referred to hereinafter as Polymer C, is poly[1,4-cyclohexylene-bis-(oxyethylene)-p-phenylenediacrylate]co-3,3'-[(sodioimino)disulfonyl]dibenzoate-co-3-hydroxyisophthalate.

While lithographic printing plates prepared from photocrosslinkable polymers such as Polymer A, Polymer B or Polymer C have many advantageous properties, they suffer from certain deficiencies which have limited their commercial acceptance. Thus, for example, shelf-life can be inadequate in that significant scumming in the background areas tends to manifest itself upon aging of the plate without special treatments of the support. As described in Cunningham et al, U.S. Pat. No. 3,860,426, shelf-life is enhanced by overcoating the phosphoric-acid-anodized aluminum substrate with a subbing layer containing a salt of a heavy metal, such as zinc acetate, dispersed in a hydrophilic cellulosic material such as carboxymethylcellulose. As described in European Patent Application No. 0218160, published Apr. 15, 1987, shelf-life can also be enhanced by applying a silicate layer over the anodic layer and then subjecting the silicate layer to a passivating treatment with a salt of a heavy metal, such as zinc acetate.

Omitting the use of such overcoating or passivating treatment of the substrate results in an increasing amount of coating residue on the plate following development as the plate ages, i.e., shelf-life is inadequate. However, the presence of zinc or other heavy metals in the printing plate in extractable form is undesirable because of the potential of contaminating the developer to the point that it can no longer be legally discharged into municipal sewage systems. Moreover, even with zinc acetate passivation or the addition of zinc acetate to a cellulosic subbing layer, the presensitized printing plates exhibit a substantial increase in toe speed on aging which results in undesirably low contrast.

A further disadvantage of the aforesaid photopolymer coatings is that the quantity of coating which can be processed with a given quantity of aqueous developer is less than desirable due to the fact that the coating breaks-up as fairly large particles which tend to redeposit on the imaged areas of the printing plate. The photopolymer coatings can be caused to break-up into finer particles upon development by drying them at higher temperatures than normally used. The use of higher drying temperatures, however, increases manufacturing costs and decreases production efficiency. Furthermore, although the particle sizes are finer, the quantity of photopolymer coating which can be processed before redeposit begins to occur is still less than desirable.

Other disadvantages associated with the use of the aforesaid photopolymers in lithographic printing plates include a tendency for undesirable mottle formation to occur and the need to use an undesirably high concentration of organic solvent in an aqueous-based developing composition. Mottle is particularly affected by the mechanics of film drying, determined by such factors as solvent evaporation rates.

Blinding problems are commonly encountered with commercially available aqueous-developable lithographic printing plates, so that there is an acute need in the art for an additive that is capable of improving ink receptivity.

It is known to incorporate non-light-sensitive, film-forming, resins in radiation-sensitive compositions of the type described hereinabove. For example, U.S. Pat. No. 3,929,489 refers to the use of phenolic resins, epoxy resins, hydrogenated rosin, poly(vinyl acetals), acrylic polymers, poly(alkylene oxides), and poly(vinyl alcohol) and U.S. Pat. No. 4,425,424 specifically discloses the use of polystyrene resin. These resins are employed for such purposes as controlling wear resistance of the coating, improving resistance to etchants and increasing the thickness of the radiation-sensitive layer so as to ensure complete coverage of the relatively rough metal substrate and thereby prevent blinding. However, these resins do not impart beneficial properties with respect to shelf-life or processing characteristics.

It is toward the objective of providing an improved radiation-sensitive composition, useful in the production of lithographic printing plates, that overcomes one or more of the disadvantages described above that the present invention is directed.

SUMMARY OF THE INVENTION

In accordance with this invention, a combination of polymeric additives is incorporated in a radiation-sensitive composition which includes a photocrosslinkable polymer containing the photosensitive group.

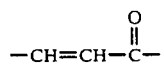

as an integral part of the polymer backbone. The combination of polymeric additives comprises (1) a polymer of vinyl pyrrolidone and (2) an unsaturated polyester which is a copolyester of an unsaturated dicarboxylic acid and an oxyalkylene ether of an alkylidene diphenol. This combination improves the properties of the radiation-sensitive composition in regard to such factors as shelf-life, image contrast, developability and ink receptivity and thereby provides a superior negative-working lithographic printing plate.

The polymer of vinyl pyrrolidone employed in this invention can be a homopolymer of vinyl pyrrolidone or a copolymer of vinyl pyrrolidone with an ethylenically-unsaturated copolymerizable monomer such as vinyl acetate.

DESCRIPTION OF THE PREFERRED EMBODIMENTS

The following copending commonly assigned U.S. patent applications are directed to inventions which are closely related to that described herein:

(1) U.S. patent application Ser. No. 554,239, filed July 17, 1990, "Radiation-Sensitive Composition Containing a Poly(N-Acyl-Alkyleneimine) and Use Thereof in Lithographic Printing Plates" by Paul R. West et al.

(2) U.S. patent application Ser. No. 554,231, filed July 17, 1990, "Radiation-Sensitive Composition Containing An Unsaturated Polyester and Use Thereof in Lithographic Printing Plates" by Paul R. West et al.

(3) U.S. pat. application Ser. No. 554,232, filed July 17, 1990, "Radiation-Sensitive Composition Containing a Vinyl Pyrrolidone Polymer and Use Thereof in Lithographic Printing Plates" by Paul R. West et al.

and (4) U.S. pat. application Ser. No. 554,229, filed July 17, 1990, "Radiation-Sensitive Composition Containing Both a Poly(N-Acyl-Alkyleneimine) and An Unsaturated Polyester and Use Thereof in Lithographic Printing Plates" by Paul R. West et al.

As indicated hereinabove, the radiation-sensitive compositions of this invention contain a polymer of vinyl pyrrolidone, including homopolymers and copolymers with ethylenically unsaturated copolymerizable monomers. Preferably, the copolymer is one which contains at least 50 mole percent of vinyl pyrrolidone.

The homopolymer of vinyl pyrrolidone, i.e., poly(N-vinyl-2-pyrrolidone) is represented by the formula:

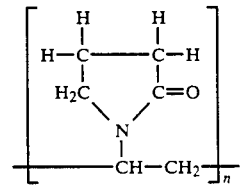

wherein n represents a whole number, e.g., a number sufficiently high to provide a molecular weight of from several hundred to several hundred thousand. These polymers are well known and can be prepared, for example, by processes of polymerization of N-vinyl-2-pyrrolidone, disclosed in U.S. Pat. No. 2,265,540, issued Dec. 9, 1941 and U.S. Pat. No. 2,335,454, issued Nov. 30, 1943.

Ethylenically unsaturated monomers copolymerizable with vinyl pyrrolidone include:
vinyl acetate
vinyl propionate
vinyl chloride
styrene
methylacrylate
methylmethacrylate
ethylacrylate
n-propylacrylate
ethylmethacrylate
butylacrylate
butylmethacrylate
methylacrylamide
methylmethacrylamide
N-acryloylmorpholine
N-acryloylpiperidine vinylpyridine and the like.

Two or more of such polymerizable monomers can, if desired, be interpolymerized with vinyl pyrrolidone.

Examples of copolymers of vinyl pyrrolidone particularly useful in combination with or as an alternative to poly(N-vinyl-2-pyrrolidone) in the present invention include:

copoly(vinylacetate/N-vinyl-2-pyrrolidone)
copoly(N-acryloylmorpholine/N-vinyl-2-pyrrolidone)
copoly(N-acryloylpiperidine/N-vinyl-2-pyrrolidone)
copoly(methylacrylate/N-vinyl-2-pyrrolidone)
copoly(styrene/N-vinyl-2-pyrrolidone)
copoly(ethyl methacrylate/N-vinyl-2-pyrrolidone)
copoly(4-vinylpyridine/N-vinyl-2-pyrrolidone) and the like.

As indicated hereinabove, the radiation-sensitive compositions of this invention include an unsaturated polyester as well as a polymer of vinyl pyrrolidone. The unsaturated polyester employed in this invention is a copolyester of an unsaturated dicarboxylic acid such as fumaric acid or maleic acid, or mixtures thereof, and an oxyalkylene ether of an alkylidene diphenol. A typical example is the copolyester of fumaric acid which has the formula:

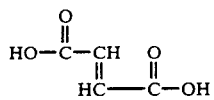

and polyoxpropylene-2,2'-bis(4-hydroxyphenyl)-propane which has the formula:

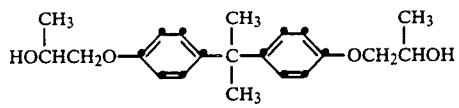

Such copolyesters are well known in the art and are described, for example, in British Patents 722,264, 722,265, 722,266 and 722,273. They are available commercially from Reichhold Chemicals, Inc., as ATLAC 382E BISPHENOL FUMARATE RESIN (also known as ATLAC 32-629-00) and related resins ATLAC 382.05 (a solution of ATLAC 382E in styrene), ATLAC 32-631-000 (also known as ATLAC 382ES), ATLAC 32-628-00 (also known as ATLAC 382A) and ATLAC 32-630-00 (also known as ATLAC 382ESA).

To prepare the unsaturated polyester, an alkylene oxide, such as propylene oxide, is condensed with an alkylidene diphenol such as bisphenol-A, to give the bis-hydroxyalkyl derivative which, in turn, is reacted with an unsaturated acid, such as fumaric acid, to give the unsaturated polyester.

As described in British Patent No. 722,264, the suitable oxyalkylene ethers of an alkylidene diphenol can be generically represented by the formula:

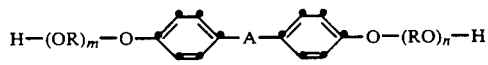

wherein A is a 2-alkylidene radical of 3 or 4 carbon atoms, R is an alkylene radical of 2 or 3 carbon atoms, m and n are each at least one and the sum of m and n is not greater than 3. The esterifying dicarboxylic acid is predominantly fumaric acid, or maleic acid or mixtures thereof, but may include minor proportions of saturated aliphatic acids, aromatic acids or other unsaturated aliphatic acids, such as, for example, succinic acid, sebacic acid, phthalic acid or itaconic acid.

Each of the polymer of vinyl pyrrolidone and the copolyester of an unsaturated dicarboxylic acid and an oxyalkylene ether of an alkylidene diphenol is typically incorporated in the radiation-sensitive composition in an amount of from about 2 to about 30 percent by weight based on total polymer content, and more particularly in an amount of from about 5 to about 15 percent by weight.

Copolyesters of an unsaturated dicarboxylic acid and an oxyalkylene ether of an alkylidene diphenol have been found to be especially useful in controlling the break-up of the photopolymer coatings in aqueous developing solutions. Specifically, the presence of the copolyester results in finer particle sizes upon processing of such coatings with aqueous developers. The copolyester additive is less prone than other polymeric additives to extraction from crosslinked portions of photopolymer coatings upon processing. It has also been found to improve the rate of initial ink-up of printing plates and to counteract the blinding tendencies caused by addition of vinyl pyrrolidone polymers to the photopolymer coating. (The term "blinding" refers to rendering the image area non-ink-receptive.)

The radiation-sensitive compositions of this invention comprise photocrosslinkable polymers, such as polyesters, containing the photosensitive group

as an integral part of the polymer backbone. For example, preferred photocrosslinkable polymers are polyesters prepared from one or more compounds represented by the following formulae:

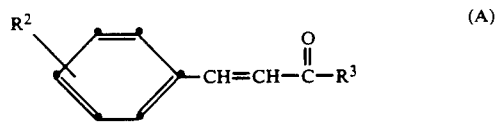

where $R^2$ is one or more alkyl of 1 to 6 carbon atoms, aryl of 6 to 12 carbon atoms, aralkyl of 7 to 20 carbon atoms, alkoxy of 1 to 6 carbon atoms, nitro, amino, acrylic, carboxyl, hydrogen or halo and is chosen to provide at least one condensation site; and $R^3$ is hydroxy, alkoxy of 1 to 6 carbon atoms, halo or oxy if the compound is an acid anhydride. A preferred compound is p-phenylene diacrylic acid or a functional equivalent thereof. These and other useful compounds are described in U.S. Pat. No. 3,030,208 (issued Apr. 17, 1962 to Schellenberg et al); U.S. Pat. No. 3,702,765 (issued Nov. 14, 1972 to Laakso); and U.S. Pat. No. 3,622,320 (issued Nov. 23, 1971 to Allen), the disclosures of which are incorporated herein by reference.

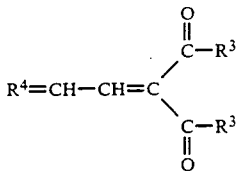 (B)

$R^3$ is as defined above, and $R^4$ is alkylidene of 1 to 4 carbon atoms, aralkylidene of 7 to 16 carbon atoms, or a 5- to 6-membered heterocyclic ring. Particularly useful compounds of formula (B) are cinnamylidenemalonic acid, 2-butenylidenemalonic acid, 3-pentenylidenemalonic acid, o-nitrocinnamylidene malonic acid, naphthylallylidenemalonic acid, 2-furfurylideneethylidenemalonic acid and functional equivalents thereof. These and other useful compounds are described in U.S. Pat. No. 3,674,745 (issued July 4, 1972 to Philipot et al), the disclosure of which is incorporated herein by reference.

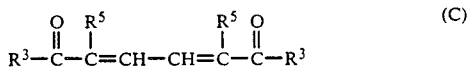 (C)

$R^3$ is as defined above; and $R^5$ is hydrogen or methyl. Particularly useful compounds of formula (C) are trans, trans-muconic acid, cis-transmuconic acid, cis, cis-muconic acid, $\alpha,\alpha'$-cis, trans-dimethylmuconic acid, $\alpha,\alpha'$-cis, cis-dimethylmuconic acid and functional equivalents thereof. These and other useful compounds are described in U.S. Pat. No. 3,615,434 (issued Oct. 26, 1971 to McConkey), the disclosure of which is incorporated herein by reference.

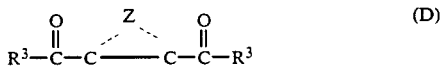 (D)

$R^3$ is as defined above; and Z represents the atoms necessary to form an unsaturated bridged or unbridged carbocyclic nucleus of 6 or 7 carbon atoms. Such nucleus can be substituted or unsubstituted. Particularly useful compounds of formula (D) are 4-cyclohexene-1,2-dicarboxylic acid, 5-norbornene-2,3-dicarboxylic acid, hexachloro-5[2:2:1]-bicycloheptene-2,3-dicarboxylic acid and functional equivalents thereof. These and other useful compounds are described in Canadian Pat. No. 824,096 (issued Sept. 30, 1969 to Mench et al), the disclosure of which is incorporated herein by reference.

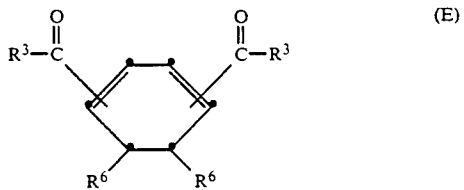 (E)

$R^3$ is as defined above; and $R^6$ is hydrogen, alkyl 1 to 12 carbon atoms, cycloalkyl of 5 to 12 carbon atoms or aryl of 6 to 12 carbon atoms. $R^6$ can be substituted where possible, with such substituents as do not interfere with the condensation reaction, such as halo, nitro, aryl, alkoxy, aryloxy, etc. The carbonyl groups are attached to the cyclohexadiene nucleus meta or para to each other, and preferably para. Particularly useful compounds of formula (E) are 1,3-cyclohexadiene-1,4-dicarboxylic acid, 1,3-cyclohexadiene-1,3-dicarboxylic acid, 1,5-cyclohexadiene-1,4-dicarboxylic acid and functional equivalents thereof. These and other useful compounds are described in Belgian Patent No. 754,892 (issued Oct. 15, 1970), the disclosure of which is incorporated herein by reference.

Preferred photocrosslinkable polyesters for use in this invention are p-phenylene diacrylate polyesters.

Printing plates of this invention comprise a support having coated thereon a layer containing the radiation-sensitive composition described above. Such plates can be prepared by forming coatings with the coating composition and removing the solvent by drying at ambient or elevated temperatures. Any one of a variety of conventional coating techniques can be employed, such as extrusion coating, doctor-blade coating, spray coating, dip coating, whirl coating, spin coating, roller coating, etc.

Coating compositions containing the mixture of polymers of this invention can be prepared by dispersing or dissolving the polymers in any suitable solvent or combination of solvents used in the art to prepare polymer dopes. The solvents are chosen to be substantially unreactive toward the polymers within the time period contemplated for maintaining the solvent and polymer in association and are chosen to be compatible with the substrate employed for coating. While the best choice of solvent will vary with the exact application under consideration, exemplary preferred solvents include alcohols, such as butanol and benzyl alcohol; ketones, such as acetone, 2-butanone and cyclohexanone; ethers, such as tetrahydrofuran and dioxane; 2-methoxyethyl acetate; N,N'-dimethylformamide; chlorinated hydrocarbons such as chloroform, trichloroethane, 1,2-dichloroethane, 1,1-dichloroethane, 1,1,2-trichloroethane, dichloromethane, tetrachloroethane, chlorobenzene; and mixtures thereof.

Suitable supports can be chosen from among a variety of materials which do not directly chemically react with the coating composition. Such supports include fiber based materials such as paper, polyethylene-coated paper, polypropylene-coated paper, parchment, cloth, etc.; sheets and foils of such materials as aluminum, copper, magnesium zinc, etc.; glass and glass coated with such metals as chromium alloys, steel, silver, gold, platinum, etc.; synthetic resin and polymeric materials such as poly(alkyl acrylates), e.g., poly(methyl methacrylate), polyester film base, e.g., poly(ethylene terephthalate), poly(vinyl acetals), polyamides, e.g., nylon and cellulose ester film base, e.g., cellulose nitrate, cellulose acetate, cellulose acetate propionate, cellulose acetate butyrate and the like.

Preferred support materials include zinc, anodized aluminum, grained aluminum, and aluminum which has been grained and anodized. Particularly preferred support materials are described in Miller et al, U.S. Pat. No. 4,647,346, issued Mar. 3, 1987, and Huddleston et al, U.S. Pat. No. 4,865,951, issued Sept. 12, 1989.

The support can be preliminarily coated—i.e., before receipt of the radiation-sensitive coating—with known subbing layers such as copolymers of vinylidene chloride and acrylic monomers—e.g., acrylonitrile, methyl acrylate, etc. and unsaturated dicarboxylic acids such as itaconic acid, etc.; carboxymethyl cellulose, gelatin; polyacrylamide; and similar polymer materials. A preferred subbing composition comprises benzoic acid and is described in Miller et al, U.S. Pat. No. 4,640,886, issued Feb. 3, 1987.

The optimum coating thickness of the radiation-sensitive layer will depend upon such factors as the particular application to which the printing plate will be put, and the nature of other components which may be present in the coating. Typical coating thicknesses can be from about 0.05 to about 10.0 microns or greater, with thicknesses of from 0.1 to 2.5 microns being preferred.

The printing plate of this invention can be exposed by conventional methods, for example, through a transparency or a stencil, to an imagewise pattern of actinic radiation, preferably rich in ultraviolet light, which crosslinks and insolubilizes the radiation-sensitive polymer in the exposed areas. Suitable light sources include carbon arc lamps, mercury vapor lamps. fluorescent lamps, tungsten filament lamps, "photoflood" lamps, lasers and the like. The exposure can be by contact printing techniques, by lens projection, by reflex, by bireflex, from an image-bearing original or by any other known technique.

The exposed printing plate of this invention can be developed by flushing, soaking, swabbing or otherwise treating the radiation-sensitive composition with a solution (hereinafter referred to as a developer) which selectively solubilizes (i.e., removes) the unexposed areas of the radiation-sensitive layer. The developer is preferably an aqueous solution having a pH as near to neutral as is feasible.

In a preferred form, the developer includes a combination of water and an alcohol that is miscible with water, or able to be rendered miscible by the use of cosolvents or surfactants, as a solvent system. The proportions of water and alcohol can be varied widely but are typically within the range of from 40 to 99 percent by volume water and from 1 to 60 percent by volume alcohol. Most preferably, the water content is maintained within the range of from 60 to 90 percent by volume. Any alcohol or combination of alcohols that does not chemically adversely attack the crosslinked radiation-sensitive layer during development and that is miscible with water in the proportions chosen for use can be employed. Exemplary of useful alcohols are glycerol, benzyl alcohol, 2-phenoxyethanol, 1,2-propanediol, sec-butyl alcohol and ethers derived from alkylene glycols—i.e., dihydroxy poly(alkylene oxides)—e.g., dihydroxy poly(ethylene oxide), dihydroxy poly(propylene oxide), etc.

It is recognized that the developer can, optionally, contain additional addenda. For example, the developer can contain dyes and/or pigments. It can be advantageous to incorporate into the developer anti-scumming and/or anti-blinding agents as is well recognized in the art.

A preferred developing composition for use with the novel lithographic printing plates of this invention is an aqueous composition including:

(a) a nontoxic developing vehicle, such as butyrolactone, phenoxy propanol, phenoxy ethanol, benzyl alcohol or methyl pyrrolidone, which is a non-solvent for any of the components of the lithographic plate;

(b) a first surfactant comprising a sodium, lithium or potassium salt of xylene sulfonic acid;

(c) a second surfactant comprising a sodium, lithium or potassium salt of toluene, ethyl benzene, cumene or mesitylene sulfonic acid;

(d) a third surfactant comprising a sodium, lithium or potassium salt of an alkyl benzene sulfonic acid, the alkyl group containing at least ten carbon atoms, or an alkyl naphthalene sulfonic acid, the alkyl group containing from one to four carbon atoms;

(e) a cold water soluble film-forming agent such as polyvinyl pyrrolidone, polystyrene/maleic anhydride copolymers, polyvinyl alcohol, polyvinyl methyl ethers and polystyrene/vinyl acetate copolymers;

(f) an alkanolamine desensitizing agent such as diethanolamine;

and (g) an acid, such as citric, ascorbic, tartaric, glutaric, acetic, phosphoric, sulfuric or hydrochloric acid, to control the pH of the developing composition.

These developing compositions are described in copending commonly assigned U.S. patent application Ser. No. 379,823, filed July 14, 1989, "Aqueous Developer Composition For Developing Negative-Working Lithographic Printing Plates", by J. E. Walls, the disclosure of which is incorporated herein by reference. A developing composition of this type is commercially available from Eastman Kodak Company, Rochester, New York, as KODAK AQUEOUS PLATE DEVELOPER MX-1469-1.

After development, the printing plate can be treated in any known manner consistent with its intended use. For example, lithographic printing plates are typically subjected to desensitizing etches.

In addition to the photocrosslinkable polymer, the vinyl pyrrolidone polymer and the copolyester of an unsaturated dicarboxylic acid and an oxyalkylene ether of an alkylidene diphenol, a number of other addenda can be present in the coating composition and ultimately form a part of the completed printing plate. For example, radiation sensitivity of the radiation-sensitive polymeric composition can be enhanced by incorporating therein one or more spectral sensitizers. Suitable spectral sensitizers include anthrones, nitro sensitizers, triphenylmethanes, quinones, cyanine dyes, naphthones, pyrylium and thiapyrylium salts, furanones, anthraquinones, 3-ketocoumarins, thiazoles, thiazolines, naphthothiazolines, quinalizones, and others described in U.S. Pat. No. 4,139,390 and references noted therein. Preferred sensitizers include the 3-ketocoumarins described in U.S. Pat. No. 4,147,552 and the thiazoline sensitizers of U.S. Pat. No. 4,062,686. Such sensitizers can be present in the compositions in effective sensitizing amounts easily determined by one of the ordinary skill in the art.

The coating composition can contain pigments preferably having a maximum average particle size less than about 3 micrometers. These pigments can provide a visible coloration to an image before or after development of the element. Useful pigments are well known in the art and include titanium dioxide, zinc oxide, copper phthalocyanines, halogenated copper phthalocyanines, quinacridine, and colorants such as those sold commercially under such trade names as Monastral Blue and Monastral Red B. The pigments are generally present in the compositions in an amount within the range of from 0 to about 50 percent (by weight) based on the total dry composition weight. Preferred amounts are within the range of from about 5 to about 20 percent (by weight).

It is frequently desirable to add print out or indicator dyes to the compositions to provide a colored print out image after exposure. Useful dyes for such purpose include monoazo, diazo, methine, anthraquinone, triarylmethane, thiazine, xanthene, phthalocyanine, azine, cyanine and leuco dyes as described, for example, in U.S. Pat. Nos. 3,929,489 and 4,139,390 and references noted therein. Such dyes are present in amounts readily determined by a person of ordinary skill in the art.

It is recognized that the radiation-sensitive composition of this invention can become crosslinked prior to intended exposure if the compositions or printing plates of this invention are stored at elevated temperatures, in areas permitting exposure to some quantity of actinic radiation and/or for extended periods of time. To insure against crosslinking the composition inadvertently before intended exposure to actinic radiation, stabilizers can be incorporated into the radiation-sensitive compositions and printing plates of this invention. Useful stabilizers include picoline N-oxide; phenols, such as 2,6-di-tert-butyl-p-cresol, 2,6-di-tert-butylanisole and p-methoxy-phenol; hydroquinones such as hydroquinone, phloroglucinol and 2,5-di-tert-butylhydroquinone; triphenylmetallics, such as triphenylarsine; triphenylstilbene; and tertiary amines, such as N-methyldiphenylamine.

Still other addenda useful in the printing plates of this invention include antioxidants, surfactants, anti-scumming agents, and others known in the art.

Binders or extenders can optionally be incorporated into the radiation-sensitive composition. Such binders or extenders can be present in an amount within the range of from 0 to about 50 percent (by weight) based on total dry composition weight. Suitable binders include styrene-butadiene copolymers; silicone resins; styrene-alkyd resins; silicone-alkyd resins; soya-alkyd resins; poly(vinyl chloride); poly(vinylidene chloride); vinylidene chlorideacrylonitrile copolymers; poly(vinyl acetate); vinyl acetate-vinyl chloride copolymers; poly(vinyl acetals), such as poly(vinyl butyral); polyacrylic and methacrylic esters, such as poly(methyl methacrylate), poly(n-butyl methacrylate) and poly(isobutyl methacrylate); polystyrene; nitrated polystyrene; polymethylstyrene; isobutylene polymers; polyesters, such as poly(ethylene-coalkaryloxy-alkylene terephthalate); phenolformaldehyde resins; ketone resins; polyamides; polycarbonates; polythiocarbonates, poly(ethylene 4,4′-isopropylidenediphenylene terephthalate); copolymers of vinyl acetate such as poly(vinyl-m-bromobenzoate-co-vinyl acetate); ethyl cellulose, poly(vinyl alcohol), cellulose acetate, cellulose nitrate, chlorinated rubber and gelatin. Methods of making binders or extenders of this type are well known in the prior art. A typical resin of the type contemplated for use is Piccolastic A50 TM, commercially available from Hercules, Inc., Wilmington, Del. Other types of binders which can be used include such materials as paraffin and mineral waxes.

The invention is further illustrated by the following examples of its practice.

EXAMPLE 1

Coating compositions useful in preparing lithographic printing plates were prepared in accordance with the following formulations:

| Component | Amounts (grams) | | |
|---|---|---|---|
| | Composition 1 | Composition 2 | Composition 3 |
| (1) Polymer A (15% by weight solution in 1,2-dichloroethane) | 144.16 | | |
| (2) Polymer B (15% by weight solution in 1,2-dichloroethane) | | 144.15 | |
| (3) Polymer C (15% by weight solution in 1,2-dichloroethane) | | | 144.15 |
| (4) MONASTRAL Red pigment (7% by weight dispersion in 1,2-dichloroethane) | 52.13 | 51.54 | |
| (5) MONASTRAL Blue pigment (7% by weight dispersion in 1,2-dichloroethane) | | | 18.49 |
| (6) 2-[Bis(2-furoyl)methylene-1-methyl-naptho[1,2-d]thiazoline | 0.63 | | 0.83 |
| (7) 3,3′-Carbonylbis(5,7-di-n-propoxycoumarin) | | 1.03 | |
| (8) 2,6-Di-t-butyl-p-cresol | 0.60 | 0.68 | 0.60 |
| (9) N-(4-Chlorobenzenesulfonyloxy)-1,8-naphthalimide | 1.77 | 1.14 | 1.42 |
| (10) Dihydroanhydropiperidinohexose reductone | 0.08 | 0.02 | 0.03 |
| (11) Leuco propyl violet | 0.46 | 0.28 | 0.27 |
| (12) MODAFLOW coating aid* | 0.02 | | |
| (13) FC-430 surfactant** | | 0.15 | 0.23 |
| (14) 1,2-Dichloroethane | 597.06 | 597.06 | 630.90 |

*MODAFLOW coating aid is a copolymer of ethyl acrylate and 2-ethylhexyl acrylate manufactured by Monsanto Corporation.
**FC-430 surfactant is a mixture of fluoroaliphatic polymeric esters manufactured by Minnesota Mining and Manufacturing Company.

In the above formulations, (1), (2) and (3) serve as film-forming polymers, (4) and (5) serve as colorants, (6) and (7) serve as spectral sensitizers, (8) serves as a stabilizer, (9) serves as a photooxidant, (10) serves as an antioxidant, (11) serves as a print-out dye, (12) and (13) serve as coating aids and (14) serves as a solvent.

A control coating was prepared by incorporating polystyrene resin (available under the trademark Piccolastic A-50 from Hercules, Inc.) in the formulation of Composition 1 in an amount of 15.3% of the total polymer content. Compositions within the scope of the present invention were prepared containing varying amounts of poly(N-vinyl-2-pyrrolidone), referred to hereinafter as PVP, and ATLAC 382-E resin.

Printing plates were prepared by coating the radiation-sensitive composition over a phosphoric acid-anodized aluminum substrate provided with a thin carboxymethyl cellulose subcoat. The printing plates were tested in order to compare ink receptivity of the coating. Following exposure and development, the number of impressions required to bring the printed image to full ink density with no streaking was determined. For comparison purposes, the same evaluation was made for the control coatings and the test coatings. The results are reported in Table I below.

TABLE I

| Test | Additive Wt. % | Coating Wt. (g/m$^2$) | Number of Impressions | |
|---|---|---|---|---|
| | | | Initial Roll-up | After Cleaning |
| Control A | none | 0.84 | 18 | 100 |
| Control B | Piccolastic A-50 (15.3) | 0.88 | 12 | 100 |
| Control C | Piccolastic A-50 (15.3) | 1.33 | 5 | 22 |
| Control D | PVP (7.7) | 1.26 | 14 | 100 |
| 1 | ATLAC 382E/PVP (11/7) | 1.07 | 4 | 7 |
| 2 | ATLAC 382E/PVP (11/7) | 1.30 | 5 | 9 |

It is desirable to have plates roll-up to full ink density with a minimum number of impressions to reduce paper waste as well as to improve press efficiency. A good printing plate can generally be expected to produce acceptable prints in about 10 impressions or fewer. Brush-grained plates with coating weights of less than about 1 g/m$^2$ tend to be slow to roll-up to full ink density. Control tests A and B show that at low coating weights the roll-up rate is unacceptably slow with the photopolymer alone or even with the benefit of an oleophilic additive like polystyrene. In contrast, the ATLAC/PVP combinations rolled-up quickly at relatively low coating weights as in test 1 or at the normal coating weight used in test 2. The effectiveness of the ATLAC/PVP combination is surprising in view of the apparently adverse effects of PVP alone on roll-up and blinding as shown in Control D. Finally, Control C demonstrates that even the incorporation of highly oleophilic additives such as polystyrene at normal coating weights is not nearly as effective at resisting the blinding effects of certain plate cleaner treatments as is the ATLAC/PVP combination.

EXAMPLE 2

Coatings similar to those in Example 1 were prepared using the formulations of Compositions 2 and 3. The coatings were similarly processed and tested for their ink receptivity. Satisfactory prints were obtained after only 10 impressions for Composition 2 with 15.3% ATLAC 382E and after only 7 impressions for Composition 3 with ATLAC 382E as 15.3% of the total polymer.

EXAMPLES 3-4

Incubation tests were carried out to determine the effectiveness of a combination of a vinyl pyrrolidone polymer and a copolyester of an unsaturated dicarboxylic acid and an oxyalkylene ether of an alkylidene diphenol in providing and maintaining high contrast. In carrying out these tests, printing plates were prepared by coating the photosensitive formulation identified as Composition 1 in Example 1, containing additives as indicated below, onto phosphoric acid-anodized aluminum in an amount sufficient to provide a Polymer A coverage of 810 milligrams per square meter. The contrast of each coating was determined from its sensitometric response immediately after coating and again after incubation for two weeks at 50° C. Control A had a thin subcoat of carboxymethyl cellulose which contained zinc acetate in order to stabilize the photosensitive coating sufficiently to be able to measure the speed response after incubation. Control B and Examples 3 and 4 also had a thin subcoat of carboxymethyl cellulose, but the subcoat did not contain any zinc acetate. All coatings were processed with Kodak Aqueous Plate Developer MX-1469-1, available from Eastman Kodak Company, Rochester, New York.

The results obtained are indicated in Table II below.

TABLE II

| Test No. | Additive | Coating Weight (mg/m$^2$) | Fresh Contrast | Incubated Contrast |
|---|---|---|---|---|
| Control Test A | Polystyrene | 146 | 1.6 | 0.71 |
| Control Test B | Polystyrene | 146 | 1.6 | * |
| Example 3 | PVP/ATLAC 382E | 73/73 | 1.5 | 1.2 |
| Example 4 | S-630**/ATLAC 382E | 73/73 | 1.15 | 1.0 |

*This coating failed the incubation test, so that a contrast reading could not be made.
**S-630 is a copolymer of vinyl pyrrolidone (60%) and vinyl acetate (40%) available commercially from GAF Corporation.

As indicated by the data in Table II, coatings in which polystyrene was utilized as the additive, namely Control A and Control B, were not able to maintain high contrast values. In Control A, which utilized zinc acetate in the subbing layer, the contrast dropped from 1.6 to 0.71, i.e., it dropped to less than half its original value. Control B, which also employed polystyrene and did not utilize zinc acetate, failed the incubation test, i.e., unexposed areas of the plate could not be developed cleanly and left coating residues. On the other hand, Examples 3 and 4, each of which utilized a combination of a polymer of vinyl pyrrolidone and a copolyester of an unsaturated dicarboxylic acid and an oxyalkylene ether of an alkylidene diphenol, experienced a drop in contrast of no more than twenty percent and maintained the contrast level at one or above.

EXAMPLE 5

A printing plate was prepared as above except with a PVP coating weight of 73 mg/m$^2$ and an ATLAC coating weight of 110 mg/m$^2$ added to the formulation of Composition 1 under Example 1. A freshly coated plate was processed as described above for Examples 3 and 4, and the optical density of the resulting plate was measured. The procedure was repeated for a plate which had been maintained at 50° C. for two weeks, whereupon it was found that the optical density had increased by only 0.02. Comparison of the background optical densities for fresh and incubated plates of Control test coating B showed an increase of 0.07. The increase in optical density of the background for the Control B plates corresponds to a tendency for the background areas to become "sensitive" and print in the non-image areas when mounted on a printing press.

EXAMPLE 6

Compositions within the scope of the present invention were prepared by incorporating poly(vinyl-2-pyrrolidone) and ATLAC 382E in amounts of 7.4% and 11.1% by weight, respectively, relative to the total polymer content of Compositions 2 and 3 under Example 1. Each composition was used to prepare a lithographic printing plate by coating it over a phosphoric acid-anodized aluminum substrate provided with a thin carboxymethyl cellulose subcoat. All coatings were baked for 2 minutes at 100° C. as an accelerated aging test. All of the coatings could be imaged and developed cleanly after the bake treatment, while the comparison coating Control B from Examples 3 and 4 that contained the polystyrene resin left a heavy coating residue on the substrate under the same conditions. These results demonstrate the ability of combinations of poly(vinyl pyrrolidone) and ATLAC 382E resin to improve the shelf-life of the radiation-sensitive photopolymer coatings without having to resort to the use of treatments with heavy metal salts such as zinc acetate.

EXAMPLE 7

Presensitized lithographic printing plates containing 810 mg/m$^2$ of polymer A, 54 mg/m$^2$ of PVP and 91 mg/m$^2$ of ATLAC 382E resin were machine processed in a processor charged with 19 liters of Kodak Aqueous Plate Developer MX-1469-1.

The plates were processed cleanly even after 500 square meters of coating had been developed. By way of comparison, coatings with 810 mg/m$^2$ of Polymer A and 151 mg/m$^2$ of polystyrene resin also processed cleanly with the fresh developer, but an unacceptable level of polymer redeposit onto the imaged area was noted on the plates when only 130 to 170 square meters had been processed through a processor charged with 38 liters of developing solution. It was possible to extend the amount of coating which could be processed without redeposit to 280 square meters by changing the drying conditions. However, even these coatings showed redeposit when processed through the same developer which successfully processed 500 square meters of coating containing the combination of PVP and ATLAC 382E resin. These results demonstrate the ability of a combination of a vinyl pyrrolidone polymer and a copolyester of an unsaturated dicarboxylic acid and an oxyalkylene ether of an alkylidene diphenol to extend the amount of coating which can be effectively processed with a given quantity of developing solution.

A further benefit of the use of the ATLAC and PVP additives was noted in the experiment described above. The apparent photospeeds of the Control plates (810 mg/m$^2$ Polymer A, 151 mg/m$^2$ polystyrene) and of the Example plates (810 mg/m$^2$ Polymer A, 54 mg/m$^2$ PVP and 91 mg/m$^2$ ATLAC 382E) were determined at various stages of processor usage. As can be seen in the results summarized in Table III, the apparent photospeed of the Control plates increased continuously as the developer in the machine processor accumulated material from processed coatings. In contrast, the apparent photospeed of the Example plates increased more slowly and appeared to level off to a speed which was essentially independent of the amount of processed coating accumulated in the developer. Such behavior is advantageous, as it reduces the necessity of adjusting exposures to account for the condition of the developer in a machine processor and also helps reduce the need for replenishment of the developer in the course of operating the machine processor.

TABLE III

| Amount of Processed Coating (m$^2$) | Relative Photospeed | |
|---|---|---|
| | Control | Example |
| 0 (fresh developer) | 121 | 126 |
| 139 | 138 | 136 |
| 279 | 143 | 141 |
| 372 | 147 | 142 |
| 465 | 154 | 142 |

Homopolymers of vinyl pyrrolidone and copolymers containing at least 50 mole percent of vinyl pyrrolidone are both solvent soluble and water soluble. These solubility characteristics render them especially advantageous for use in the present invention since they facilitate both coating from solvent solution to form the radiation-sensitive layer and subsequent development by the use of "aqueous" developing solutions, i.e., developing solutions which are predominantly water but do contain small amounts of organic solvent. Incorporation of the polymer of vinyl pyrrolidone in the radiation-sensitive composition permits the use of lower concentrations of organic solvent in the aqueous developing solution, as compared with an otherwise identical composition that does not contain the polymer of vinyl pyrrolidone. Addition of the copolyester of an unsaturated dicarboxylic acid and an oxyalkylene ether of an alkylidene diphenol provides still further improvements. Thus, for example, it causes the coating to break-up into finer particle sizes, it improves the rate of initial ink-up and it counteracts the tendency of vinyl pyrrolidone polymers to cause blinding.

The most important benefits obtained from use of a copolyester of an unsaturated dicarboxylic acid and an oxyalkylene ether of an alkylidene diphenol, as described herein, are improved roll-up and decreased sensitivity to blinding. Coatings containing these copolyesters are less susceptible to the effects of varying coverage on roll-up. They roll-up quicker in general, especially in comparison between plates which have been stored for several days or more before going to press.

Current trends in the lithographic printing plate industry favor the use of "aqueous developers." By this is meant that the developer used to process the printing plate, either by hand or by machine, contains little or no organic solvent and that any organic solvent which is present is nontoxic and a high boiling material with a very low vapor pressure. Other ingredients included in the developer, such as salts and surfactants, are nontoxic and biodegradable. The present invention is especially well adapted, by virtue of the polymeric materials incorporated in the radiation-sensitive composition, for use with such "aqueous developers."

The invention has been described in detail with particular reference to preferred embodiments thereof, but it will be understood that variations and modifications can be effected within the spirit and scope of the invention.

We claim:

1. A negative-working lithographic printing plate comprising a support having thereon a radiation-sensitive layer of a composition comprising a mixture of (A) a photocrosslinkable p-phenylene diacrylate polyester containing the photosensitive group

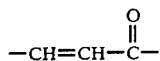

as an integral part of the polymer backbone, (B) a polymer of vinyl pyrrolidone, and (C) a copolyester of an unsaturated dicarboxylic acid and an oxyalkylene ether of an alkylidene diphenol.

2. A negative-working lithographic printing plate as claimed in claim 1, wherein said support is an anodized aluminum support.

3. A negative-working lithographic printing plate as claimed in claim 2, including a subbing layer between said anodized aluminum support and said radiation-sensitive layer.

4. A negative-working lithographic printing plate as claimed in claim 2, wherein said polymer of vinyl pyrrolidone is a homopolymer of vinyl pyrrolidone.

5. A negative-working lithographic printing late as claimed in claim 2, wherein said polymer of vinyl pyrrolidone is a copolymer of vinyl pyrrolidone with an ethylenically unsaturated copolymerizable monomer in which said copolymer contains at least 50 mole percent of vinyl pyrrolidone.

6. A negative-working lithographic printing plate as claimed in claim 5, wherein said ethylenically unsaturated copolymerizable monomer is vinyl acetate.

7. A negative-working lithographic printing plate as claimed in claim 2, wherein said unsaturated dicarboxylic acid is selected from the group consisting of fumaric acid, maleic acid and mixtures thereof.

8. A negative-working lithographic printing plate as claimed in claim 2, wherein said copolyester is a copolyester of fumaric acid and an oxyalkylene ether of an alkylidene diphenol of the formula:

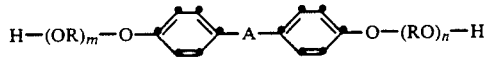

wherein A is a 2-alkylidene radical of 3 or 4 carbon atoms, R is an alkylene radical of 2 or 3 carbon atoms, m and n are each at least one and the sum of m and n is not greater than 3.

9. A negative-working lithographic printing plate as claimed in claim 2, wherein said copolyester is a copolyester of fumaric acid and polyoxypropylene-2,2'-bis(4-hydroxyphenyl)propane.

10. A negative-working lithographic printing plate as claimed in claim 2, wherein each of said polymer of vinyl pyrrolidone and said copolyester is present in said radiation-sensitive layer in an amount of from about 2 to about 30 percent by weight based on total polymer content.

11. A negative-working lithographic printing plate as claimed in claim 2, wherein each of said polymer of vinyl pyrrolidone and said copolyester is present in said radiation-sensitive layer in an amount of from about 5 to about 15 percent by weight based on total polymer content.

12. A negative-working lithographic printing plate comprising an anodized aluminum support having thereon a radiation-sensitive layer of a composition comprising a mixture of (A) a photocrosslinkable polymer comprised of recurring units of the formula:

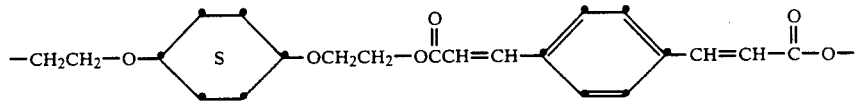

(B) poly(N-vinyl-2-pyrrolidone) and (C) a copolyester of fumaric acid and polyoxypropylene-2,2'-bis(4-hydroxyphenyl)propane.

13. A negative-working lithographic printing plate comprising an anodized aluminum support having thereon a radiation-sensitive layer of a composition comprising a mixture of (A) poly[1,4-cyclohexylene-bis(oxyethylene)-p-phenylene diacrylate]-co-3,3'-[(sodioimino)disulfonyl]dibenzoate, (B) poly(N-vinyl-2-pyrrolidone) and (C) a copolyester of fumaric acid and polyoxypropylene-2,2'-bis(4-hydroxyphenyl)propane.

14. A negative-working lithographic printing plate comprising an anodized aluminum support having thereon a radiation-sensitive layer of a composition comprising a mixture of (A) poly[1,4-cyclohexylene-bis-(oxyethylene)-p-phenylenediacrylate]-co-3,3'-[(sodioimino)disulfonyl]dibenzoate-co-3-hydroxyisophthalate, (B) poly(N-vinyl-2-pyrrolidone) and (C) a copolyester of fumaric acid and polyoxypropylene-2,2'-bis(4-hydroxyphenyl)propane.

* * * * *